(12) United States Patent
Chu et al.

(10) Patent No.: US 7,059,389 B2
(45) Date of Patent: Jun. 13, 2006

(54) INTEGRATED COOLING UNIT

(75) Inventors: Richard C. Chu, Poughkeepsie, NY (US); Michael J. Ellsworth, Jr., Lagrangeville, NY (US); Robert E. Simons, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 701 days.

(21) Appl. No.: 09/965,507

(22) Filed: Sep. 27, 2001

(65) Prior Publication Data

US 2003/0056939 A1 Mar. 27, 2003

(51) Int. Cl.
*H05K 7/20* (2006.01)

(52) U.S. Cl. ............... 165/80.4; 165/125; 257/714; 361/699

(58) Field of Classification Search ............ 165/122, 165/125, 132, 80.4; 257/714; 361/699
See application file for complete search history.

(56) References Cited

U.S. PATENT DOCUMENTS

| 1,729,420 | A | * | 9/1929 | Eisenhauer | 165/122 |
| 1,821,754 | A | * | 9/1931 | Huyette | 165/132 |
| 1,821,765 | A | * | 9/1931 | Newman | 165/128 |
| 2,029,890 | A | * | 2/1936 | Newman | 165/132 |
| 2,469,259 | A | * | 5/1949 | Burgess | 165/122 |
| 2,654,583 | A | * | 10/1953 | Treanor | 165/104.34 |
| 3,586,101 | A | * | 6/1971 | Chu et al. | 165/104.25 |
| 3,993,125 | A | | 11/1976 | Rhodes | |
| 4,217,816 | A | * | 8/1980 | Mancinelli | 454/351 |
| 4,332,293 | A | | 6/1982 | Hiramatsu | |
| 4,468,357 | A | * | 8/1984 | Miller et al. | 261/29 |
| 5,031,694 | A | | 7/1991 | Lloyd | |
| 5,731,954 | A | * | 3/1998 | Cheon | 361/699 |
| 5,943,211 | A | * | 8/1999 | Havey et al. | 361/699 |
| 6,327,145 | B1 | * | 12/2001 | Lian et al. | 361/697 |
| 6,447,270 | B1 | * | 9/2002 | Schmidt et al. | 165/80.4 |

FOREIGN PATENT DOCUMENTS

JP 11223478 8/1999

* cited by examiner

*Primary Examiner*—Leonard R. Leo
(74) *Attorney, Agent, or Firm*—Lily Neff; Cantor Colburn LLP

(57) ABSTRACT

An integrated cooling unit configured to effect the removal of heat via a circulating liquid coolant includes a reservoir to contain the liquid coolant, a tubing arrangement disposed at an outer surface of the reservoir, a pump disposed within the reservoir, and a fan configured to provide a flow of air across the tubing arrangement to remove the heat. The tubing arrangement is fluidly communicable with a heat exchanging device, and the pump is configured to circulate the liquid coolant through the tubing arrangement to the heat exchanging device.

12 Claims, 5 Drawing Sheets

INTEGRATED COOLING UNIT

BACKGROUND

In nearly every sector of the electronics industry, electronic circuitry involves the interconnection of componentry such as integrated chips and bus elements. During operation of such componentry, heat is generated and a heat flux is established with the surrounding environment. In order to ensure the continued proper functioning of the circuitry, the heat is removed and dispersed to the surrounding environment. As the amount of heat generated increases, the use of flowing air to remove and dissipate the heat presents system engineers and designers with increasingly complex challenges. Nevertheless, because cooling with air places minimal demands upon the installation and operability of the circuitry, air cooling systems remain as the cooling means of choice in many electronics applications.

Such applications oftentimes incorporate the heat removal capabilities of water cooling systems at electronic modules of the circuitry by utilizing water-to-air cooling loop configurations. Water-to-air cooling loop configurations generally include discretely positioned units between which fluid communication is maintained via tubing lines or similar conduits. The units of such configurations include pumps to circulate cooling water, heat exchange devices to transfer heat from the circuitry to the water, fans for providing cooling air flow across the heated water, and water storage reservoirs. The aggregated componentry of such configurations may occupy considerable volumes within their respective systems. Because space is at a premium in most electronics applications, particularly as the sizes of the systems are reduced to keep pace with technological trends, cooling systems may be likewise reduced in size.

SUMMARY

This disclosure presents an apparatus for integrating the individual components of a cooling unit for electronics applications. The integrated cooling unit removes heat via a circulating liquid coolant and includes a reservoir to contain the liquid coolant, a tubing arrangement disposed at an outer surface of the reservoir, a pump disposed within the reservoir, and a fan to provide a flow of air across the tubing arrangement to remove the heat. The tubing arrangement is fluidly communicable with a heat exchanging device, and the pump circulates the liquid coolant through the tubing arrangement to the heat exchanging device.

BRIEF DESCRIPTION OF THE DRAWINGS

The present disclosure will be better understood by those skilled in the pertinent art by referencing the accompanying drawings, where like elements are numbered alike in the several FIGURES, in which.

DETAILED DESCRIPTION

Figure 1:
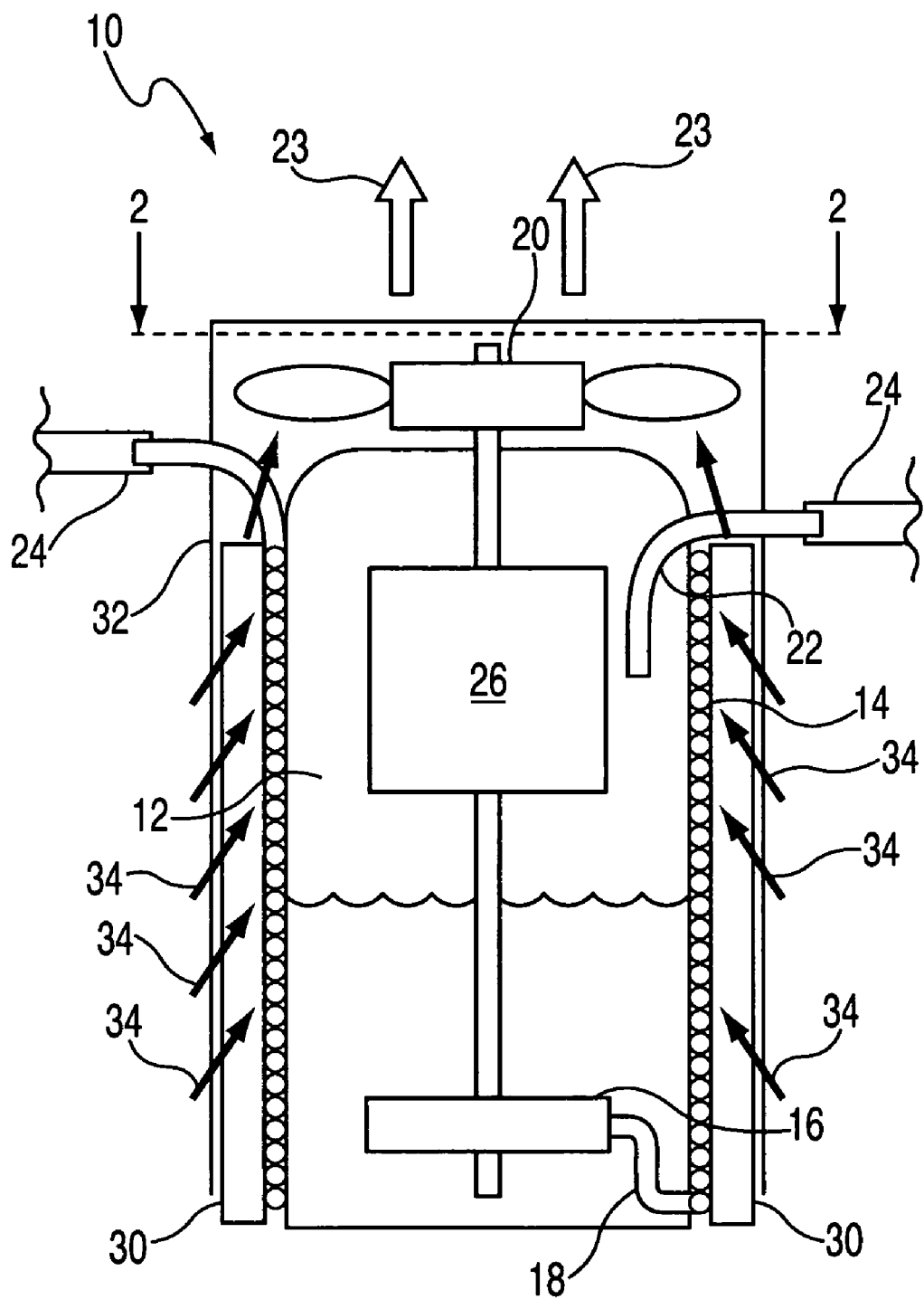
FIG. 1 is a side schematic view of an exemplary embodiment of an integrated cooling unit.

Referring to FIG. 1, an exemplary embodiment of an integrated cooling unit is shown generally at 10 and is hereinafter referred to as "cooling unit 10." Cooling unit 10 provides for the removal of heat from electronic circuitry via circulation of a liquid coolant and the dissipation of the removed heat via forced convection of air. The circulation of the liquid coolant allows heat to be transferred to the coolant and subsequently removed by a fan that forces air over the circulating coolant. Although cooling unit 10 is described as being incorporable into computer-based applications in which heat is removed from electronic circuitry and dissipated through a liquid medium, it should be understood by those of skill in the art that cooling unit 10 may be utilized in other applications in which heat is generated and is to be dissipated to the surrounding environment. Furthermore, although cooling unit 10 is referred to as utilizing water as the circulating coolant, it should be understood by those of skill in the art that other liquids such as brine, alcohols, fluorocarbons, and halogenated hydrocarbons may be used.

Cooling unit 10 comprises a reservoir 12 configured to receive water, a tubing arrangement disposed at an outer wall of reservoir 12, a pump 16 to provide a head to the water in the tubing arrangement through an outlet port 18, a fan 20, and an inlet port 22 through which water is received into reservoir 12. The tubing arrangement is typically arranged as a coil, shown at 14, to effectively optimize the space adjacent the outer wall of reservoir 12. Inlet port 22 and coil 14 are in fluid communication with a heat exchanging device such as a cold plate (shown below with reference to FIG. 5) through conduits 24, which are tubing elements dimensioned to withstand the pressures generated during operation of cooling unit 10 and the temperatures associated with the electronic circuitry.

Coil 14 generally comprises a single coil that provides a single effluent stream from reservoir 12. In another exemplary embodiment, however, coil 14 may comprise two or more adjacently positioned and interengagingly arranged coils to form a parallel flow circuit that provides two or more effluent streams from reservoir 12. Such a system offers a lower pressure drop across reservoir 12 for the same water flow rate as a single coil unit.

A motor 26 is disposed in operable communication with pump 16 to provide water flow through coil 14 and conduits 24 to the cold plate and to power fan 20 to provide a flow of air across coil 14 to effect heat removal. Motor 26 is mounted in reservoir 12 such that when cooling unit 10 is non-operational and the water drains back into reservoir 12, the water level in reservoir 12 remains below motor 26. Pump 16 is disposed to be at or below the water level in reservoir 12 during operation of cooling unit 10. Reservoir 12 may further include a cover (not shown) to allow operator access to the interior of reservoir 12, thereby facilitating access to motor 26, pump 16, and fan 20.

In order to facilitate the flow of air to effect the removal of sensible heat from coil 14, an arrangement of fins is disposed over coil 14. Each fin 30 extends longitudinally over the individual coils transverse to the direction of curvature of the coils and radially from the outer surface of coil 14. A shroud 32 is disposed over fins 30 and extends over the height of cooling unit 10 and around the blades of fan 20. An opening that serves as a primary air inlet (shown below with reference to FIG. 3) is defined between an inner surface of shroud 32 and coil 14 at a lower end of cooling unit 10. The primary air inlet allows air to be inducted between shroud 32 and coil 14 by fan 20, which is positioned at an end cooling unit 10 distal from the primary air inlet. Shroud 32 also includes a plurality of secondary air inlets (shown below with reference to FIGS. 2 and 3) through which air is drawn in the directions of arrows 34, between adjacently positioned fins 30, and over coil 14. The air inducted through the inlets is ultimately exhausted through fan 20 in the direction indicated by arrows 23. Shroud 32 further provides some degree of protection to fins 30 from being bent, crushed, or otherwise damaged.

Figure 2:
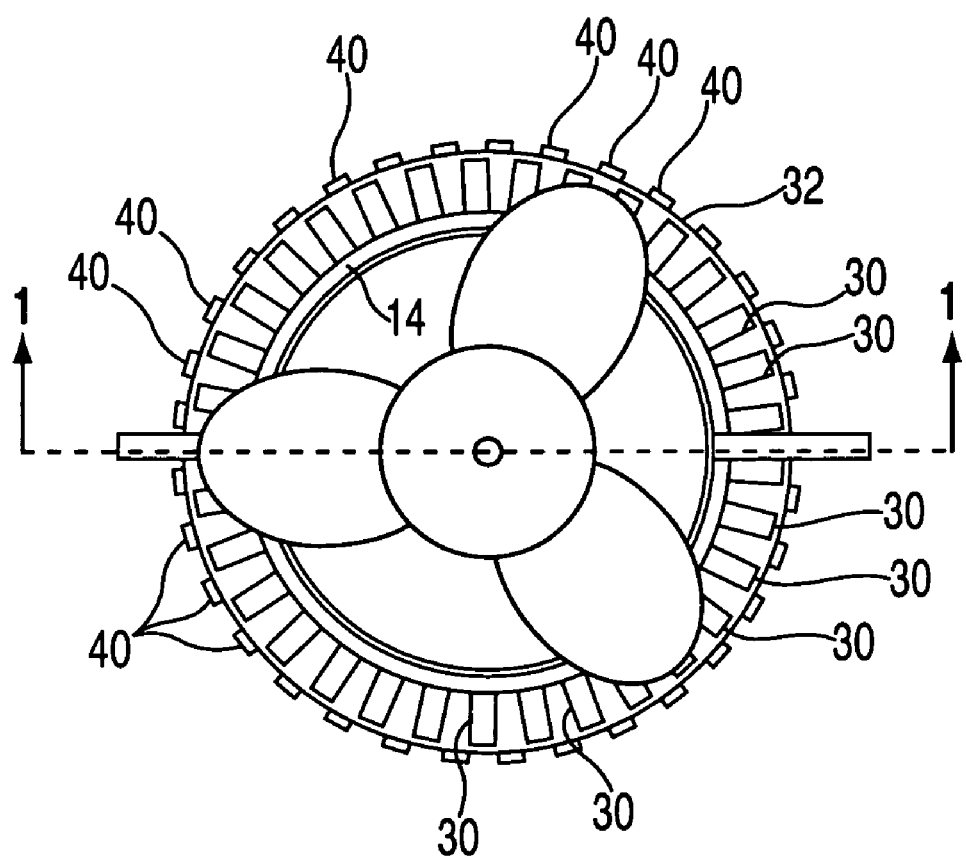
FIG. 2 is a plan schematic view of the integrated cooling unit of FIG. 1.

In FIG. 2, the arrangement of fins 30 and the secondary air inlets on shroud 32 are shown. As can be seen, fins 30 are arranged at substantially evenly spaced intervals over coils 14 and extend radially away therefrom. The secondary air inlets are disposed within the surface of shroud 32 at substantially evenly spaced cross sectional intervals and register with spaces defined by adjacently positioned fins 30. Air directing tabs 40 disposed over the secondary air inlets facilitate the induction of air into shroud 32.

Figure 3:
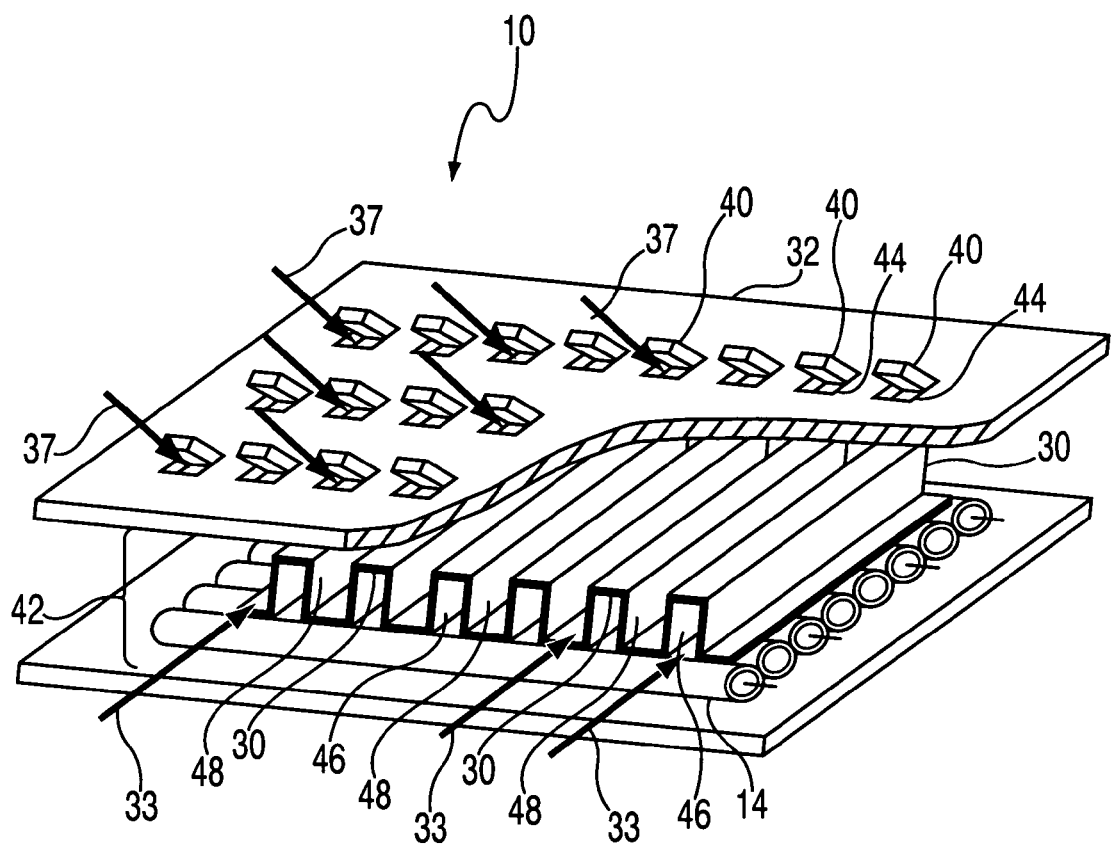
FIG. 3 is a cutaway view of a wall portion of an integrated cooling unit.

Referring now to FIG. 3, a perspective sectional view of the wall of cooling unit 10 is shown. As stated above, the arrangement of fins 30 facilitates the convective flow of air in directions indicated by arrows 33. Fins 30 are generally continuous tubular structures that extend longitudinally over the height of cooling unit 10. The tubularity of each fin 30 defines the primary air inlet 42 proximate the lower portion of cooling unit 10. The attachment of the fin arrangement to coil 14 is such that major opposing planar surfaces of fins 30 extend substantially normally from coil 14 and longitudinally along the height of cooling unit 10. Fins 30 thereby define an alternating pattern of first airflow passages 46 and second air flow passages 48 wherein first air flow passages 46 are defined by the tubularity of each fin 30 and second air flow passages 48 are defined by the spaces between adjacently positioned fins 30. Such a structure allows for the drawing of air over the maximum surface area of the fin arrangement, thereby allowing an optimum transfer of heat from coil 14 to be realized. Generally, the fin arrangement is stamped as a continuous piece from sheet metal having a high thermal conductivity value. One exemplary material having a high thermal conductivity value from which fins 30 can be fabricated is copper. Other exemplary materials from which fins 30 can be fabricated include, but are not limited to, copper alloys, aluminum, aluminum alloys, and combinations of the foregoing materials. An adhesive, such as a solder or a thermal epoxy compound, is utilized to attach the fin arrangement to coil 14.

Shroud 32, as stated above, is disposed over fins 30 to provide a protective covering over fins 30 and to define second airflow passages 48. Shroud 32 may be fabricated from any material that can be formed or molded into the appropriate shape, such as metal, plastic, or fiberglass. Openings are located at various positions longitudinally along shroud 32. Such openings are secondary air inlet ports 44, which extend through shroud 32 to allow for airflow communication between coil 14 and the environment immediately adjacent to shroud 32. Positioning of secondary air inlet ports 44 to register with second air flow passages 48 facilitates the drawing of air into the fin arrangement (as is illustrated by arrows 37) to mitigate the temperature rise of air flowing in second air flow passages 48, thereby improving the overall heat transfer performance of cooling unit 10. Additionally, the use of secondary air inlet ports 48 reduces the overall air flow pressure drop over the length of each air flow passage 46, 48 to result in an increased air flow rate longitudinally along cooling unit 10.

If shroud 32 is fabricated from metal, the openings defining secondary air inlet ports 48 can be formed by stamping and bending the material of shroud 32. In particular, as is shown in FIG. 3, all but one of the edges by which each air inlet port 46, 48 is to be defined is cut through the surface of shroud 32. The one edge of each secondary air inlet port 48 proximate the uppermost portion of cooling unit 10 is left intact, thereby allowing the metal to be bent away from shroud 32 to form air-directing tab 40. If shroud 32 is fabricated from a plastic material, air-directing tab 40 can be molded directly therein. The degree to which the metal is bent or to which the plastic is molded to form tab 40 is such that upon operation of the fan, air is drawn through primary air inlet port 42 in the direction of the fan and through second air flow passages 48 and across coil 14.

Figure 4:
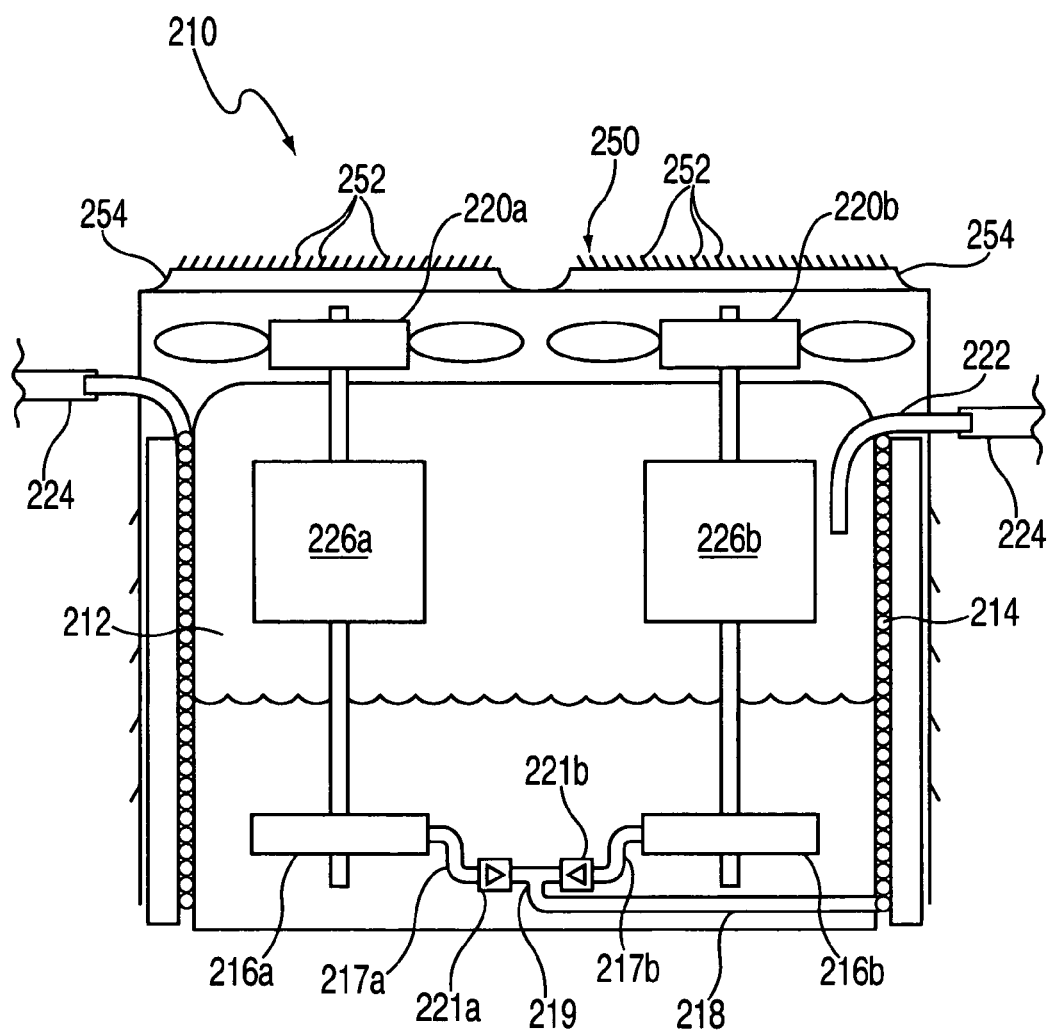
FIG. 4 is a side schematic view of an exemplary embodiment of an integrated cooling unit having a dual fan/motor/pump configuration.

Another exemplary embodiment of an integrated cooling unit may be configured to incorporate a pump/motor/fan assembly having multiple motors, as is shown in FIG. 4. Such a cooling unit, referred to hereinafter as "cooling unit 210," provides a redundancy to the unit to sustain the proper amount of cooling in the event that one motor becomes inoperable. Cooling unit 210 is dimensioned and each motor is sized to provide for a sufficient amount of airflow upon operation of a system into which cooling unit 210 is incorporated when only one of the motors is operational. Alternately, cooling unit 210 can be configured such that more than one motor can be operated to provide additional cooling to the system into which cooling unit 210 is incorporated.

Cooling unit 210 comprises a reservoir 212 configured to receive water through an inlet port 222, a coil 214 disposed about reservoir 212, a first pump 216a and a second pump 216b, each pump 216a, 216b being configured to provide a head to the water, an outlet port 218 disposed in communication with each pump 216a, 216b, first and second fans 220a, 220b, and first and second motors 226a, 226b respectively associated with pumps 216a, 216b and fans 220a, 220b. Inlet port 222 and coil 214 are in fluid communication with a cold plate (not shown) through conduits 224. Motors 226a, 226b are configured to drive pumps 216a, 216b and inlet fans 220a, 220b.

Outlet port 218 is defined by an outlet line common to both pumps 216a, 216b. Pump outlet lines 217a, 217b are disposed in fluid communication with each pump 216a, 216b and outlet port 218. A tee 219 or a similar type of fitting is disposed at the juncture of outlet port 218 and pump outlet lines 217a, 217b. Disposed between tee 219 and first pump 216a is a first check valve 221a. Likewise disposed between tee 219 and second pump 216b is a second check valve 221b. Check valves 216a, 216b prevent the flow of water from an operating pump back through a non-operating pump in a system in which only one pump 216a, 216b is operational.

Cooling unit 210 further includes a louvered cover, shown generally at 250, disposed over fans 220a, 220b. Louvered cover 250 comprises vanes 252 pivotally mounted within a frame 254. During operation of cooling unit 210, air is forced up through louvered cover 250 causing vanes 252 to rotate and allowing air to be expelled from cooling unit 210. When only one fan is operational, vanes 252 over the non-operating fan rotate into the closed position to prevent the recirculation of air through vanes 252 over the non-operating fan. Furthermore, when one or both fans 220a, 220b are not operational, the pivoting of vanes 252 into the closed position to close off the associated fan(s) prevents debris or foreign objects from entering reservoir 212 through louvered cover 250. Frame 254 is pivotally mounted over fans 220a, 220b such that louvered cover 250 can be removed to allow an operator of a system into which cooling unit 210 is disposed access to reservoir 212 and pumps 216a, 216b and motors 226a, 226b therein.

Figure 5:
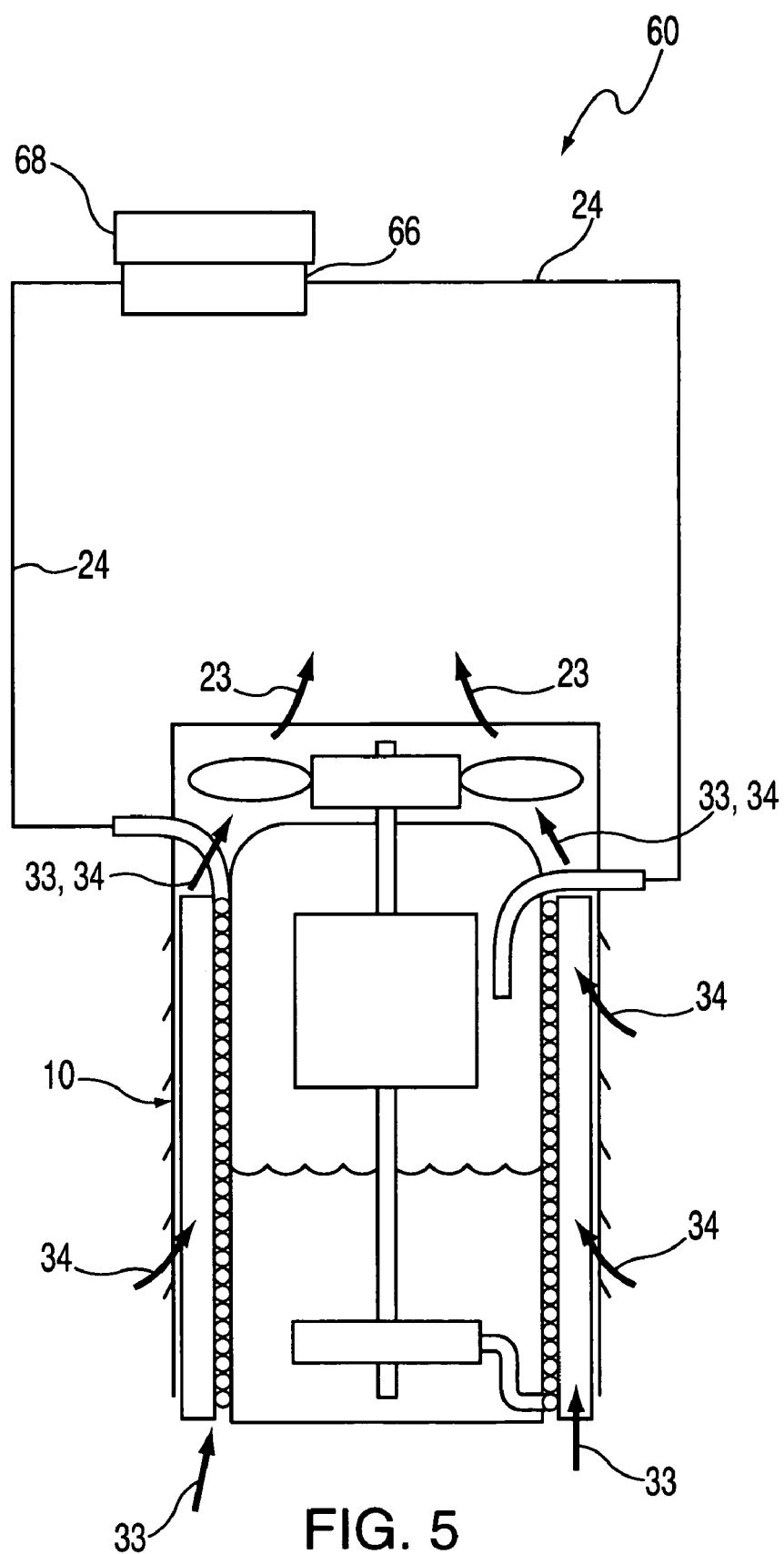
FIG. 5 is a schematic diagram of a system into which an integrated cooling unit can be incorporated.

Referring now to FIG. 5, an exemplary embodiment of a system utilized to effect thermal dissipation through fluid communication is shown generally at 60 and is hereinafter referred to as "system 60." System 60 incorporates a cooling device, for example, cooling unit 10 as was described above with reference to FIGS. 1 through 3, or cooling unit 210 as was described above with reference to FIG. 4. System 60 schematically illustrates cooling unit 10 disposed in fluid communication with a heat exchanging device such as the cold plate 66. Cold plate 66 is disposed in thermal communication with the electronic circuitry 68 from which heat is to be removed. Fluid communication between cooling unit 10 and cold plate 66 is maintained via conduits 24. A flow of air is maintained through cooling unit 10 in the directions indicated by arrows 23, 33, 34 to effect the removal of sensible heat from the liquid circulated between cold plate 66 and cooling unit 10. It should be understood by those of skill in the art that any number of cold plates 66 can be disposed along the length of conduit 24, thereby allowing heat to be removed from a plurality of electronic devices with a single cooling unit 10. It should further be understood that conduit 24 and a plurality of cold plates 66 can be arranged in any number of configurations, e.g., serially, in parallel, or combinations thereof, to provide for the effective removal of heat from each individual cold plate 66.

While the disclosure has been described with reference to a preferred embodiment, it will be understood by those skilled in the art that various changes may be made and equivalents may be substituted for elements thereof without departing from the scope of the disclosure. In addition, many modifications may be made to adapt a particular situation or material to the teachings of the disclosure without departing from the essential scope thereof. Therefore, it is intended that the disclosure not be limited to the particular embodiment disclosed as the best mode contemplated for carrying out this disclosure, but that the disclosure will include all embodiments falling within the scope of the appended claims.

The invention claimed is:

1. A cooling unit configured to circulate a liquid coolant, said cooling unit comprising:
   a reservoir configured to contain said liquid coolant;
   a tubing arrangement disposed at an outer surface of said reservoir, said tubing arrangement being fluidly communicable with a heat exchanging device;
   a pump disposed within said reservoir, said pump being configured to circulate said liquid coolant through said tubing arrangement to said heat exchanging device;
   a fan configured to provide a flow of air across said tubing arrangement,
   a plurality of fins disposed over said tubing arrangement, said fins extending longitudinally in a direction of said flow of air across said tubing arrangement;
   a shroud disposed over said fins, wherein said shroud includes a secondary air inlet disposed therein, said secondary air inlet being configured to allow for airflow communication between opposing sides of said shroud; and
   a motor disposed within said reservoir, said motor being operably connected to said pump and said fan.

2. The cooling unit of claim 1 wherein said tubing arrangement is coiled over said outer surface of said reservoir.

3. The cooling unit of claim 1 wherein said fan is configured to provide a forced induction of air over said tubing arrangement.

4. The cooling unit of claim 1 wherein said fins are tubular in structure.

5. The cooling unit of claim 4 wherein said tubularly structured fins are open at the ends thereof, thereby allowing said flow of air to be maintained within said fins.

6. The cooling unit of claim 1 wherein said fins are fabricated from a copper, copper alloys, aluminum, aluminum alloys, and combinations of the foregoing materials.

7. The cooling unit of claim 4 wherein said shroud defines a primary air inlet at a lower end thereof.

8. The cooling unit of claim 1 wherein said secondary air inlet is positioned on said shroud to register with a space defined by adjacently positioned fins.

9. The cooling unit of claim 1 wherein said secondary air inlet include an air directing tab associated therewith, said air directing tab being configured to channel air into said secondary air inlet upon a forced induction of air by said fan.

10. The cooling unit of claim 4 wherein bid shroud is fabricated from material selected from the group consisting of plastic, metal, fiberglass, and combinations of the foregoing materials.

11. The cooling unit of claim 1 further comprising a cover disposed over said fan.

12. The cooling unit of claim 11 wherein said cover comprises,
   a frame, and
   a plurality of vanes, pivotally mounted within said flame, vanes being configured to rotate into an open position in response to an airflow generated by said fan.

* * * * *